United States Patent
Chen et al.

(10) Patent No.: US 7,288,447 B2
(45) Date of Patent: Oct. 30, 2007

(54) SEMICONDUCTOR DEVICE HAVING TRENCH ISOLATION FOR DIFFERENTIAL STRESS AND METHOD THEREFOR

(76) Inventors: Jian Chen, 8413 Sweetness La., Austin, TX (US) 78750; Thien T. Nguyen, 11512 Gunfight La., Austin, TX (US) 78748; Michael D. Turner, 219 Pershing Ave., San Antonio, TX (US) 78209; James E. Vasek, 3902 John Simpson Trail, Austin, TX (US) 78732

( * ) Notice: Subject to any disclaimer, the term of this patent is extended or adjusted under 35 U.S.C. 154(b) by 151 days.

(21) Appl. No.: 10/977,226

(22) Filed: Jan. 18, 2005

(65) Prior Publication Data

US 2006/0157783 A1    Jul. 20, 2006

(51) Int. Cl.
*H01L 21/64* (2006.01)
(52) U.S. Cl. .................................. 438/165; 257/347
(58) Field of Classification Search ............. 438/149, 438/479, 405, 421, 425, 426, 435, 153, 154, 438/164, 165; 257/347, 349, 351, 622
See application file for complete search history.

(56) References Cited

U.S. PATENT DOCUMENTS

| | | | |
|---|---|---|---|
| 6,524,929 B1 | 2/2003 | Xiang | |
| 6,803,270 B2 * | 10/2004 | Dokumachi et al. | 438/231 |
| 6,887,798 B2 * | 5/2005 | Deshpande et al. | 438/777 |
| 6,955,955 B2 * | 10/2005 | Chen et al. | 438/165 |

* cited by examiner

*Primary Examiner*—Sara Crane
*Assistant Examiner*—Andrew O Arena
(74) *Attorney, Agent, or Firm*—James L. Clingan, Jr.; Susan C. Hill

(57) ABSTRACT

A semiconductor device has trenches for defining active regions. After a thin diffusion barrier is deposited in the trenches, some of the trenches are selectively etched to leave different areas in the trench. One of the areas has the diffusion barrier completely removed so that the underlying layer is exposed. Another area has the diffusion barrier remaining. An oxidation step follows so that oxidation occurs at a corner where the diffusion barrier was removed whereas the oxidation is blocked by the diffusion barrier, which functions as a barrier to oxygen. The corners for oxidation are those in which compressive stress is desirable, such as along a portion of the border of a P channel transistor. The corners where the diffusion barrier is left are those in which a compressive stress is undesirable such as the border of an N channel transistor.

5 Claims, 8 Drawing Sheets

| CHANNEL ORIENTATION | DEVICE TYPE | FAVORABLE CHANNEL STRESS | FAVORABLE WIDTH STRESS |
|---|---|---|---|
| <110> | NMOS | TENSILE | SMALL SENSITIVITY |
| <110> | PMOS | COMPRESSIVE | TENSILE |
| <100> | NMOS | TENSILE | SMALL SENSITIVITY |
| <100> | PMOS | SMALL SENSITIVITY | SMALL COMPRESSIVE |

| CHANNEL ORIENTATION | DEVICE TYPE | FAVORABLE CHANNEL STRESS | FAVORABLE WIDTH STRESS |
| --- | --- | --- | --- |
| <110> | NMOS | TENSILE | SMALL SENSITIVITY |
| <110> | PMOS | COMPRESSIVE | TENSILE |
| <100> | NMOS | TENSILE | SMALL SENSITIVITY |
| <100> | PMOS | SMALL SENSITIVITY | SMALL COMPRESSIVE |

FIG. 8

SEMICONDUCTOR DEVICE HAVING TRENCH ISOLATION FOR DIFFERENTIAL STRESS AND METHOD THEREFOR

RELATED APPLICATIONS

This application is related to US Patent Application docket number SC13410TP, titled "TRANSISTOR STRUCTURE WITH DUAL TRENCH FOR OPTIMIZED STRESS EFFECT AND METHOD THEREOF" filed concurrently herewith and assigned to the assignee hereof.

FIELD OF THE INVENTION

This invention relates to semiconductor devices that have trenches, and more particularly, to semiconductor devices that have treatment of trenches for effecting the stress on transistors.

RELATED ART

Lattice stress is recognized as affecting the mobility of transistors. For example for N channel transistors in a silicon layer, the lattice of the silicon layer is preferably under tensile stress to increase electron mobility. On the other hand, P channel transistors in a silicon layer have higher hole mobility if the silicon layer is under compressive stress in the channel length direction and tensile stress in the gate width direction. One of the characteristics of trench isolation in general is that it can affect the stress. For example, in the typical formation of a trench, there is an oxidation step which has the effect of creating a "bird's beak" in the bottom corners of the trench that cause compressive stress, which adversely effects the N channel transistors.

Thus, there is a need for a method and structure that better uses the trench in alleviating the adverse effects of stress while also beneficially using the trench for stress.

BRIEF DESCRIPTION OF THE DRAWINGS

The present invention is illustrated by way of example and not limited by the accompanying figures, in which like references indicate similar elements, and in which:

FIG. 8 is a table useful in understanding the utility of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor device has trenches for defining active regions. After a thin diffusion barrier is deposited in the trenches, some of the trenches are selectively etched to leave different areas in the trench. One of the areas has the diffusion barrier completely removed so that the underlying layer is exposed. Another area has the diffusion barrier remaining. An oxidation step follows so that oxidation occurs at a corner where the diffusion barrier was removed whereas the oxidation is blocked by the diffusion barrier, which functions as a barrier to oxygen. The corners for oxidation are those in which compressive stress is desirable, such as along a portion of the border of a P channel transistor. The corners where the diffusion barrier is left are those in which a compressive stress is undesirable such as the border of an N channel transistor. This is better understood with reference to the drawings and the following description.

Figure 1:
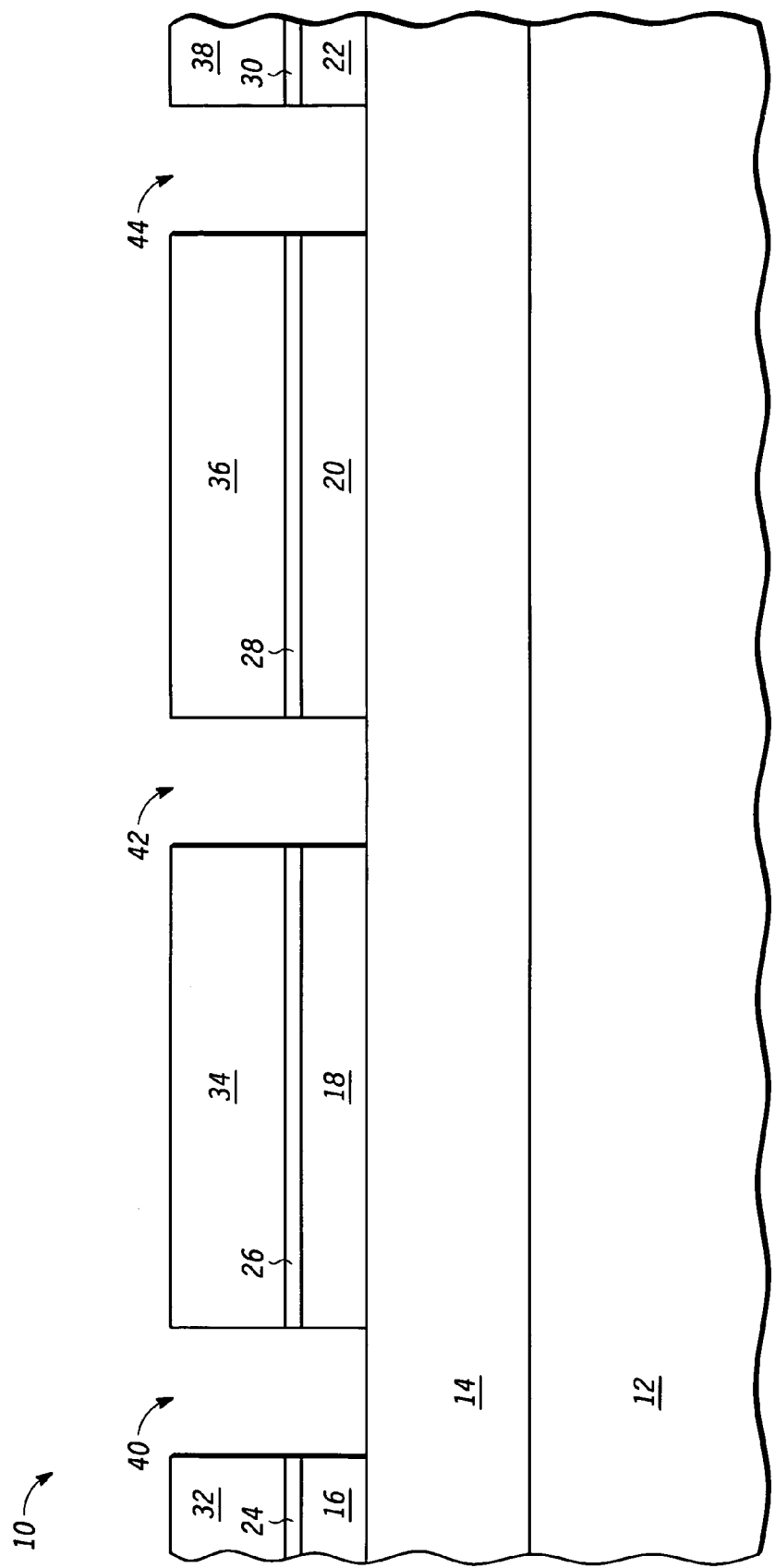
FIG. 1 is a cross section of a semiconductor device according to an embodiment of the invention at a stage in processing.

Shown in FIG. 1 is a semiconductor device structure 10 comprising a substrate 12; an insulating layer 14 over substrate 12; a patterned semiconductor layer comprising semiconductor portions 16, 18, 20, and 22; a patterned thin insulating layer comprising portions 24, 26, 28, and 30 over semiconductor portions 16, 18, 20, and 22, respectively; and an insulating layer comprising portions 32, 34, 36, and 38 over portions 24, 26, 28, and 30, respectively. This is semiconductor-on-insulator (SOI) structure that has been patterned to form trenches 40, 42, and 44. Trench 40 is an opening between semiconductor portions 16 and 18. Trench 42 is an opening between semiconductor portions 18 and 20. Trench 44 is an opening between semiconductor portions 20 and 22. Trenches 40, 42, and 44 extend to a top surface of insulating layer 14 which can also be called the trench bottom. Semiconductor portions 16, 18, 20, and 22, comprise an active semiconductor layer and are preferably silicon but could be another semiconductor material such as silicon germanium. The thickness of semiconductor portions 16, 18, 20, and 20 is preferably about 700 Angstroms. Insulating layer 14 operates as the insulator in the SOI structure and is preferably about 1500 Angstroms thick. Portions 24, 26, 28, and 30 are preferably oxide about 100 Angstroms thick. Portions 32, 34, 36, an 38 are preferably nitride about 1100 Angstroms thick. These dimensions can be altered and will almost certainly become smaller as process and lithography improvements occur.

Figure 2:
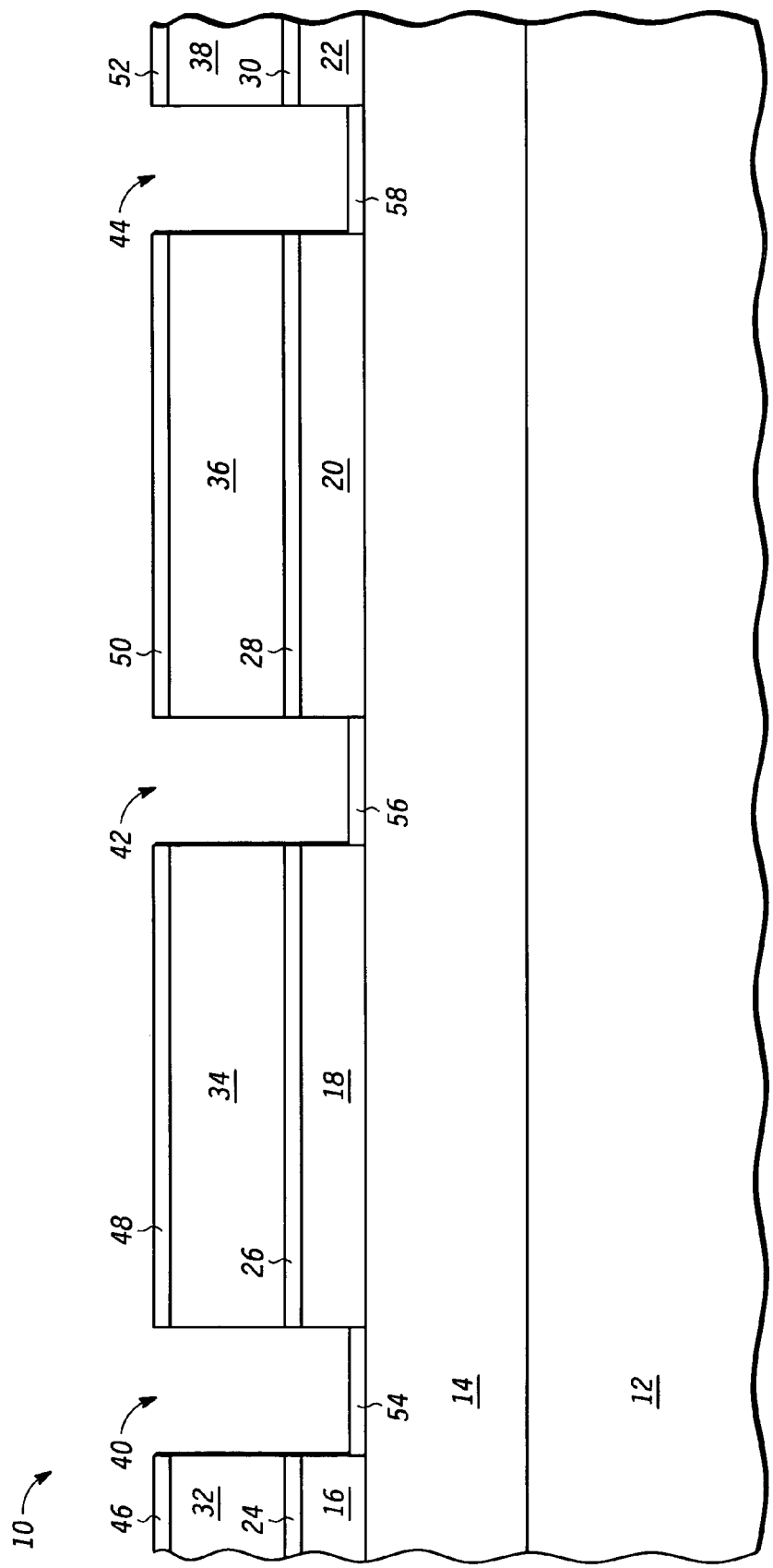
FIG. 2 is a cross section of the semiconductor device of FIG. 1 at a subsequent stage in processing.

Shown in FIG. 2 is semiconductor device structure 10 after depositing a diffusion barrier layer comprising portions 46, 48, 50, and 52 on portions 32, 34, 36, and 38 respectively, and portions 54, 56, and 58 on insulating layer 14 in trenches 40, 42, and 44, respectively. The diffusion barrier is preferably nitride in the range of 150 to 400 Angstroms, but this range could be different. The preferred nitride of portions 32, 34, 36, and 38 are preferably deposited by high temperature, low pressure LPCVD, whereas the preferred nitride of the diffusion barrier is deposited by high density, low temperature, low pressure, plasma enhanced CVD.

Figure 3:
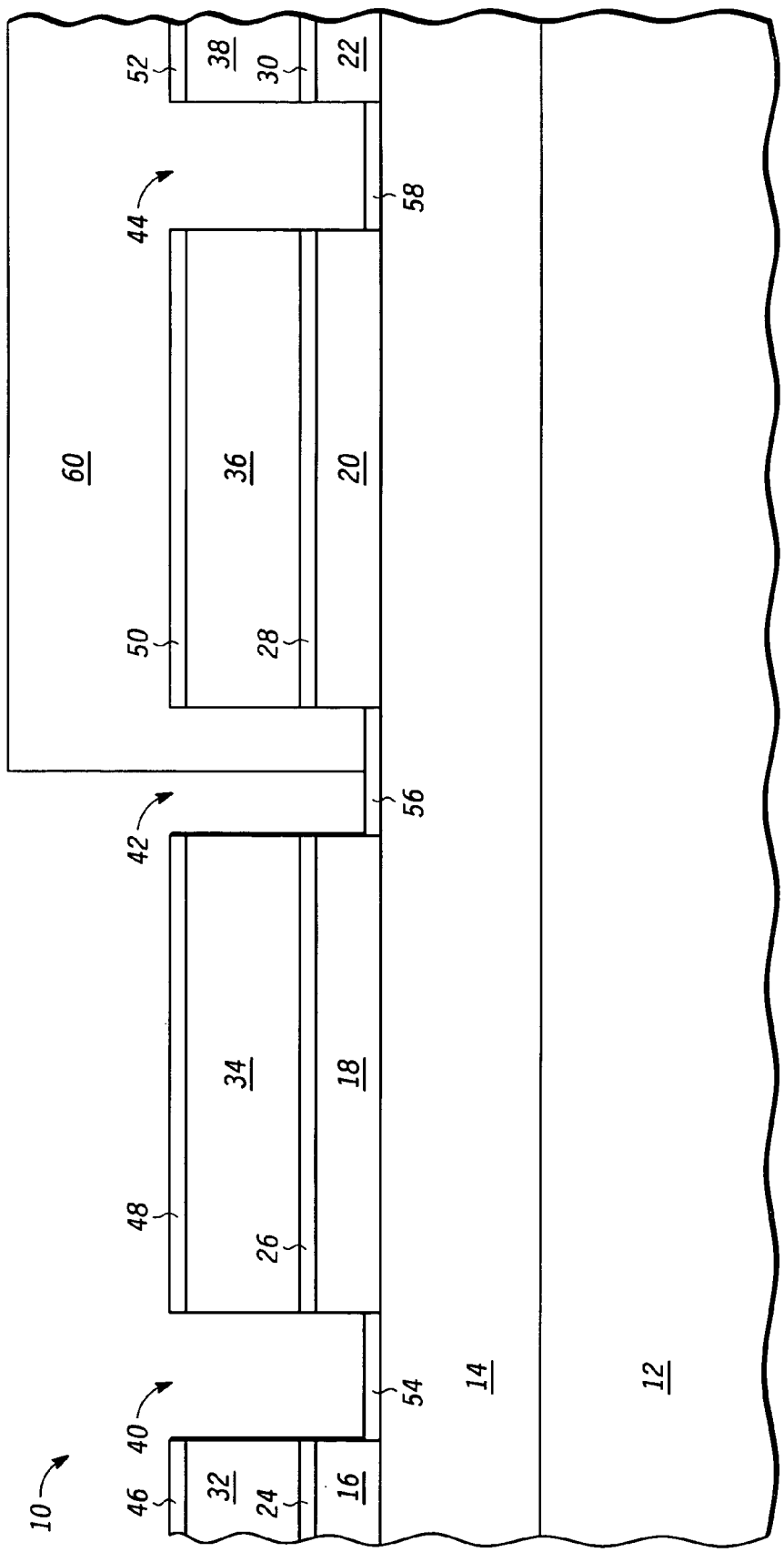
FIG. 3 is a cross section of the semiconductor device of FIG. 2 at a subsequent stage in processing.

Shown in FIG. 3 is semiconductor device structure 10 after formation of a patterned mask 60 that masks portion 58 and about half of portion 56 and leaves portion 54 exposed. An opening 42 is left between semiconductor portion 18 and mask 60, which is where about half of portion 56 is exposed. Mask 60 is preferably photoresist that has been patterned.

Figure 4:
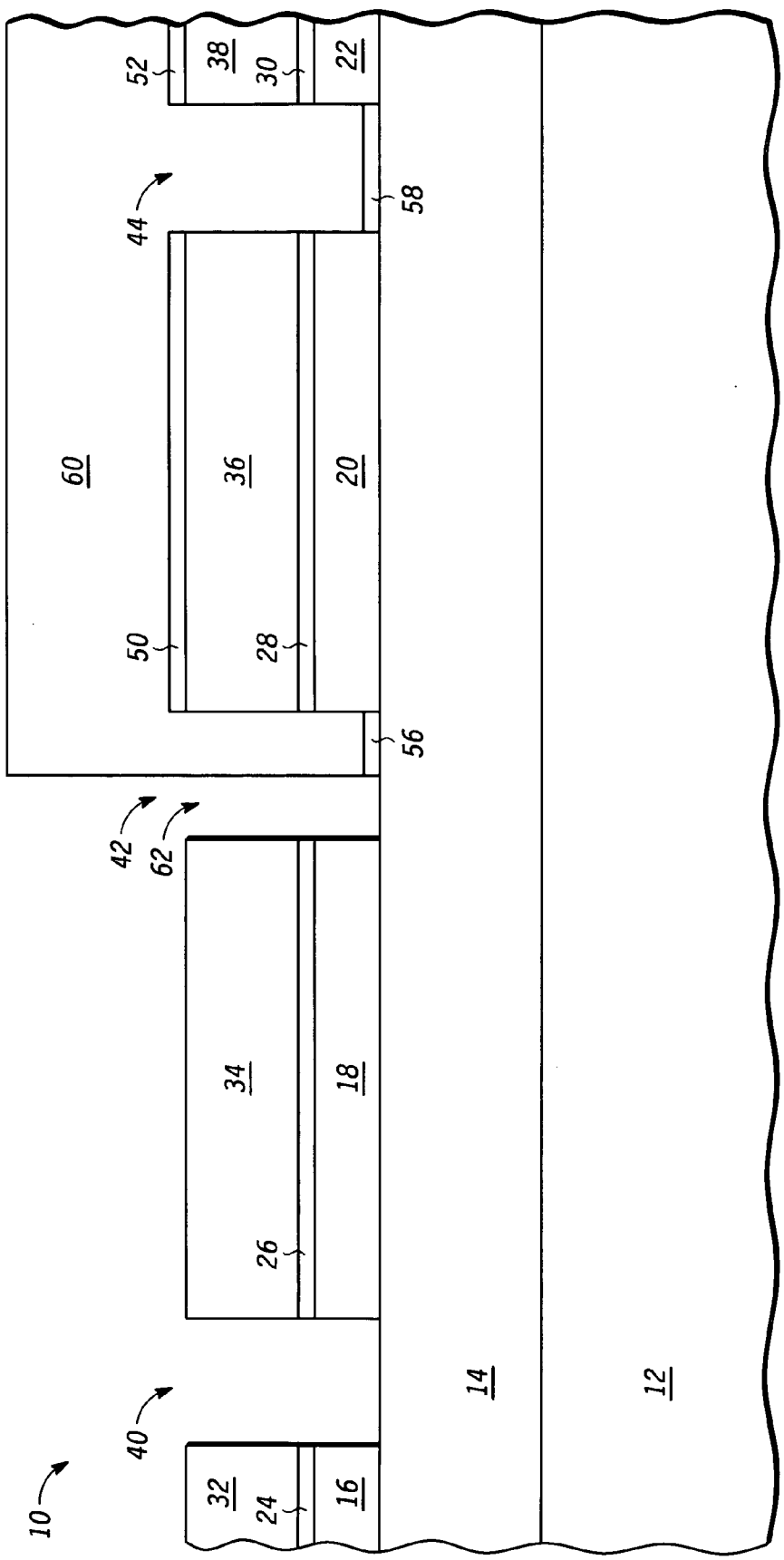
FIG. 4 is a cross section of the semiconductor device of FIG. 3 at a subsequent stage in processing.

Shown in FIG. 4 is semiconductor device structure 10 after an etch which removes portion 54 and the portion of portion 56 that is exposed by opening 62. Portion 58 remains because it is masked by mask 60. Portions 46 and 48 are also removed because they are not covered by mask 60. Portions 50 and 52 are similarly left remaining because they are covered with mask 60.

Figure 5:
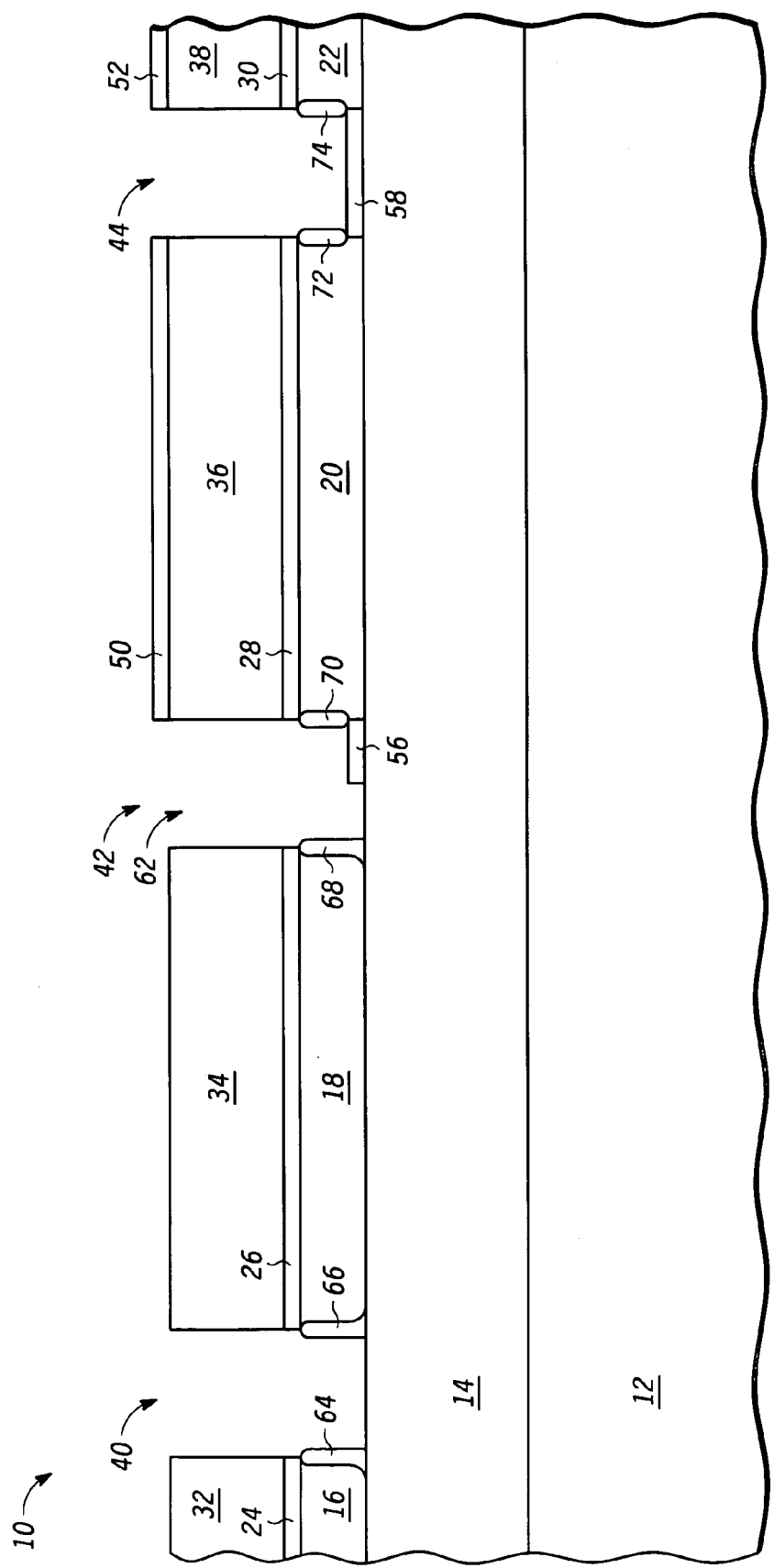
FIG. 5 is a cross section of the semiconductor device of FIG. 4 at a subsequent stage in processing.

Shown in FIG. 5 is semiconductor device structure 10 after removal of mask layer 60 and performance of an oxidation step using the remaining portion of portion 56 and portion 58 as a mask to the oxidation to form an oxide layer 64 on the sidewall of semiconductor portion 16, an oxide layer 66 in trench 40 on one sidewall of semiconductor portion 18, an oxide layer 68 in trench 42 on the other sidewall of semiconductor portion 18, an oxide layer 70 in trench 42 on one sidewall of semiconductor portion 20, an oxide layer 72 in trench 44 on the other sidewall of semiconductor portion 20, and an oxide layer 74 in trench 44 on the sidewall of semiconductor portion. The oxidation step prior to filling the trenches has been found to be beneficial in improving yields. A bird's beak is formed at the three corners shown in FIG. 5 where semiconductor portions 16 and 18 adjoin insulating layer 14. The bird's beak is believed to occur due to oxygen diffusing along and/or under a semiconductor/oxide interface. For example, oxygen diffusing from trench 42 along and/or under the border between semiconductor portion 18 and insulating layer 14. This bird's beak causes semiconductor portions 18 and 16 to be under compressive stress. On the other hand a bird's beak is neither formed in trench 44 nor in the corner of trench 42 where the remaining portion of portion 56 is present. The remaining portion of portion 56 and portion 58 act as a barrier to oxygen diffusion to prevent the bird's beak formation. Thus, semiconductor portion 20 is not subjected to the compressive stress caused by a bird's beak.

Figure 6:
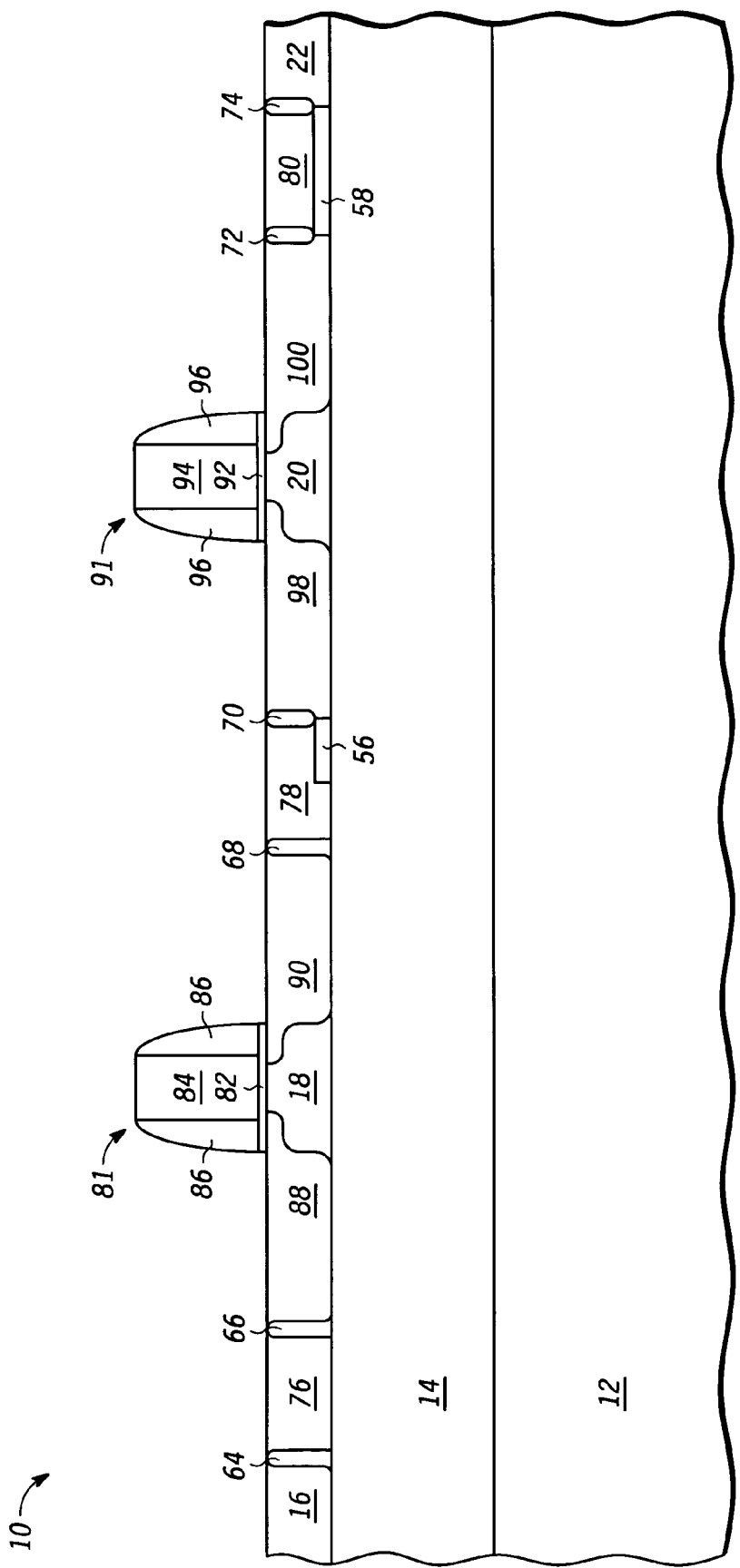
FIG. 6 is a cross section of the semiconductor device of FIG. 5 at a subsequent stage in processing.

Shown in FIG. 6 is semiconductor device structure 10 after removing portions 24, 26, 28, 30, 32, 34, 36, 38, 50, and 52; filling trenches 40, 42, and 44 with trench fill 76, 78, and 80, respectively; and forming transistors 81 and 91. These steps are all performed by conventional means in the formation of MOS transistors. Transistor 81 comprises a gate dielectric 82 formed over semiconductor portion 18, a gate 84 over gate dielectric, a sidewall spacer 86 around gate 84, a source/drain 88 in semiconductor portion 18 on one side of gate 84, and a source/drain 90 on the other side of gate 84. Transistor 91 comprises a gate dielectric 92 formed over semiconductor portion 20, a gate 94 over gate dielectric, a sidewall spacer 96 around gate 94, a source/drain 88 in semiconductor portion 18 on one side of gate 94, and a source/drain 100 on the other side of gate 94. Transistor 81 is preferably a P channel transistor in which oxide layers 66 and 68 have bird's beaks which increase the compression in semiconductor portion 18. The stress thus between oxide layers 66 and 68 is in the channel length direction. Transistor 91 is preferably N channel and has the diffusion barrier, portions 56 and 58, surrounding it so that the increase in compressive stress due to bird's beak formation is prevented. Thus, a different lattice stress is present on the different sides of the same trench by treating the two sides of the trench differently.

Figure 7:
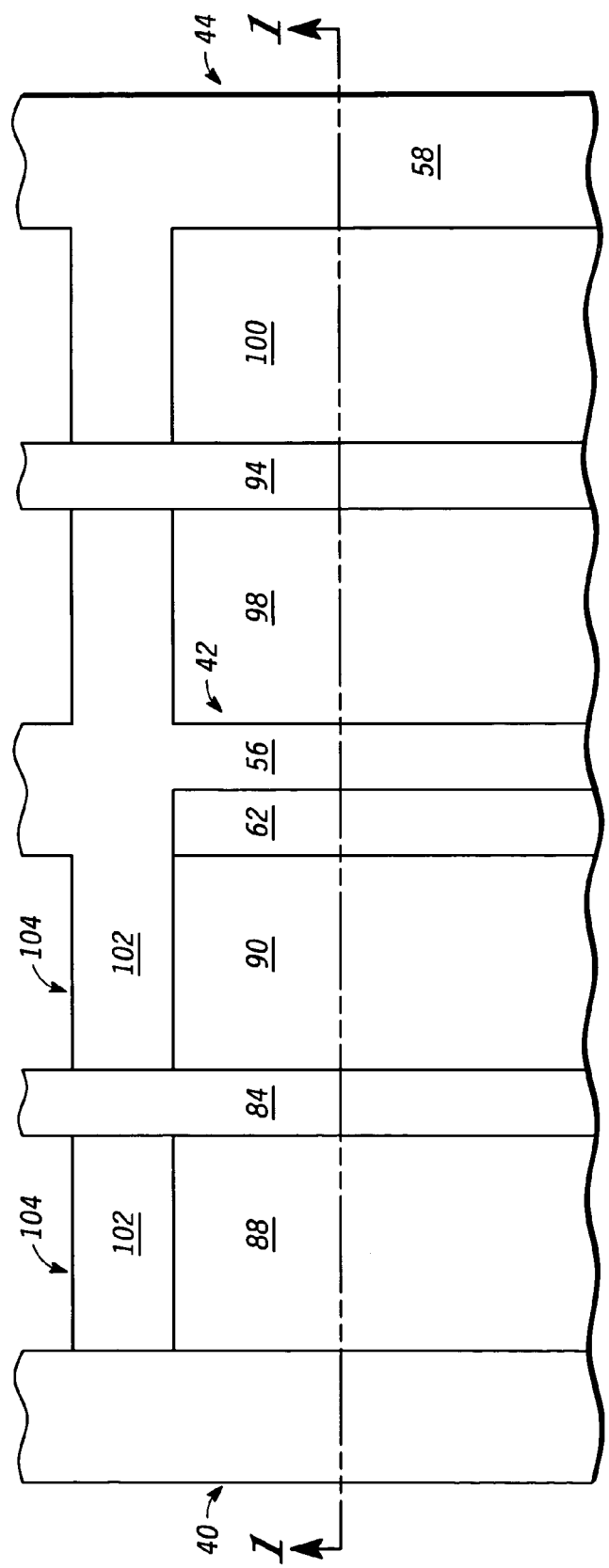
FIG. 7 is a top view of the semiconductor device of FIG. 6.

Shown in FIG. 7 is semiconductor device 10 in a top view depicting certain features shown in FIG. 6 and trench 104 and a portion 102 of the diffusion barrier in trench 104. As shown in FIG. 7, trenches 40, 42, and 44 run vertically to define active regions on the sides. Trench 104 runs horizontally and is a top border of the active regions. This shows that the diffusion barrier, in the form of portion 102 runs along the top of transistor 91 so that the compressive stress caused by the bird's beak effect is prevented from occurring in the channel width direction. The cross sections depicted in FIGS. 1-6 are taken at 1-1 shown in FIG. 7.

Shown in FIG. 8 is a chart useful in understanding the utility of selecting the various combinations of stress and crystal orientation for a given transistor type. Thus, for example, if transistor 81, which is described as P channel, has a channel crystal orientation of <110>, then the structure described herein provides for the best combination of stresses. In this example, if transistor 81 is aligned to the <110>, then transistor 91 is also <011> for which tensile is the best in the channel direction and which is achieved in this example. If the orientation for both transistors 81 and 91, were <100>, then the bird's beak would be beneficial for the P channel transistor in trench 104 where it adjoins transistor 81, but the diffusion barrier for the N channel transistor could remain the same.

A possible alternative is to form a sidewall spacer in openings 40, 42, and 44 as the diffusion barrier instead of deposited layers 54, 56, and 58. In such case it may also be beneficial to extend openings 40, 42, and 44 into layer 14 before forming the sidewall spacers. The desired portion of the sidewall spacer is subsequently removed using a masking step. A potential disadvantage of the sidewall spacer approach, especially if the sidewall spacer is nitride, is that it puts nitride in contact with semiconductor layers 16, 18, 20, and 22. Nitride in contact with the semiconductor layer in which the transistors are formed has often been found to cause problems.

In the foregoing specification, the invention has been described with reference to specific embodiments. However, one of ordinary skill in the art appreciates that various modifications and changes can be made without departing from the scope of the present invention as set forth in the claims below. For example, certain combinations were described for the bird's beak and the diffusion barrier but other locations could also be used. Certain materials were described as being preferred but other materials may also be useful. For example, a different material that is effective as a diffusion barrier to oxygen may be used in place of the described silicon nitride such as silicon carbide and silicon oxynitride. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device structure, comprising:
   providing a semiconductor-on-insulator substrate, having a semiconductor active layer, an insulation layer, and a semiconductor substrate;
   forming a first isolation trench through the semiconductor active layer, the first isolation trench having a first isolation trench bottom, the first isolation trench bottom having a first region and a second region;

forming a second isolation trench through the semiconductor active layer, the second isolation trench having a second isolation trench bottom;

forming a third isolation trench through the semiconductor active layer, the third isolation trench having a third isolation trench bottom;

depositing a diffusion barrier layer on the first, second, and third isolation trench bottoms; and selectively removing the diffusion barrier layer in the first region of the first isolation trench bottom and in the entire second isolation trench bottom, without removing the diffusion barrier layer in the second region of the first isolation trench bottom and without removing the diffusion barrier layer in the third isolation trench bottom, wherein lattice stress in the semiconductor active layer is affected by proximity to the diffusion barrier layer;

wherein said step of selectively removing the diffusion barrier layer comprises:

selectively patterning the diffusion barrier layer; and selectively etching the diffusion barrier layer to etch away the diffusion barrier layer in the first region of the isolation trench bottom and in the entire second isolation trench bottom; and wherein said step of depositing the diffusion barrier layer comprises:

anisotropically depositing the diffusion barrier layer in order to deposit more diffusion barrier layer on the first, second, and third isolation trench bottoms than on sidewalls of the first, second, and third isolation trenches.

2. The method of claim 1, wherein the first lattice stress is more compressive than the second lattice stress.

3. The method of claim 2, wherein the first lattice stress affects at least one p-channel transistor in a channel length direction.

4. The method of claim 3, wherein the second lattice stress affects at least one n-channel transistor in both the channel length direction and a channel width direction.

5. The method of claim 1, wherein the step of depositing said barrier layer comprises depositing at least one dielectric material by high density, low temperature, low pressure plasma enhanced CVD.

* * * * *